United States Patent [19]

Podell et al.

[11] 4,349,798

[45] Sep. 14, 1982

[54] COMPACT MICROWAVE RESONANT CAVITY FOR USE IN ATOMIC FREQUENCY STANDARDS

[75] Inventors: Allen F. Podell; Louis F. Mueller, both of Palo Alto, Calif.

[73] Assignee: Hewlett-Packard Company, Palo Alto, Calif.

[21] Appl. No.: 174,085

[22] Filed: Jul. 31, 1980

[51] Int. Cl.$^3$ .......................... H01P 7/06; H01S 1/06; H03L 7/26

[52] U.S. Cl. .................................... 333/230; 324/305; 331/3; 331/94.1

[58] Field of Search ............................ 331/3, 94.1, 96; 333/227, 228, 230; 324/305, 304

[56] References Cited

U.S. PATENT DOCUMENTS

| | | | |
|---|---|---|---|
| 2,611,882 | 9/1952 | Bailey | 315/39.65 X |
| 3,248,666 | 4/1966 | Farmer | 331/94 |
| 3,798,565 | 3/1974 | Jechart | 331/3 X |

FOREIGN PATENT DOCUMENTS

| | | | |
|---|---|---|---|
| 434551 | 4/1948 | Italy | 333/227 |

*Primary Examiner*—Siegfried H. Grimm
*Attorney, Agent, or Firm*—Edward Y. Wong

[57] ABSTRACT

A compact resonant cavity with a substantially uniform magnetic field in the cavity is formed by lumped resonantly loading a rectangular primary cavity. The lumped capacitive load is produced by forming secondary cavities on opposite sides of the rectangular primary cavity. The component resonant cavity is designed for applications in atomic frequency standards.

10 Claims, 12 Drawing Figures

COMPACT MICROWAVE RESONANT CAVITY FOR USE IN ATOMIC FREQUENCY STANDARDS

BACKGROUND OF THE INVENTION

Microwave resonant cavities find wide applications in atomic absorption frequency standards. In such applications, a gas vapor cell containing a vapor of a metal alkali, for example, rubidium 87, is placed within the microwave resonant cavity. Then the radio frequency power in the cavity excites the alkali to its resonant frequency which in turn stimulates atomic transition of the atoms in the gas.

A typical scheme for atomic absorption frequency standard is illustrated in FIG. 4. A light from a lamp assembly, a rubidium lamp in this example, passes through the excited gas vapor cell and impinges on a photocell. The light is detected by the photocell and is converted to an electrical signal, which is then amplified. The intensity of the detected light is proportional to the opacity of the gas vapor which, in turn, is predominantly dependent on the exciting frequency of the resonant cavity. Thus, by monitoring the opacity of the gas vapor, the exciting frequency of the resonator can be made substantially constant by appropriate feedback circuitry. It is this substantially constant and ultrastable frequency that furnishes the standard for the atomic frequency standard. The principles behind this type of atomic absorptive frequency standard are well known, and are well documented in the art through numerous publications, e.g., *Proceedings of the IEEE,* January 1963, pp. 190–202, and U.S. Pat. No. 3,798,565.

A resonant cavity for applications in atomic frequency standards ideally would have a uniform magnetic H-field which is collinear to both a biasing direct current (D.C.) magnetic C-field and the optical path defined by the lamp assembly. The H-field ideally would also be removed from the electric E-fields. By having a uniform H-field in alignment with the optical path, the opacity of the gas is substantially unaffected by the H-field. As a consequence, any variation in the opacity of the gas vapor can be attributed nearly entirely to any variation in the resonant cavity exciting frequency.

The uniform H-field should be substantially removed from the E-field so that the presence of the gas vapor cell would have a minimal effect on the resonant cavity frequency. The gas cell in the presence of a strong E-field loads the resonant cavity, thereby lowering the Q of the cavity and shifting the resonant frequency of the cavity. Furthermore, any metal alkali deposited on the glass wall of the gas vapor cell in the presence of a high E-field further loads the cavity, thereby further degrading the operation of the microwave resonant cavity.

Examples of previous designs used for such an application are shown in FIGS. 2 and 3. FIG. 2 illustrates an example of a TE011 right circular cylindrical microwave cavity; FIG. 3 shows an example of a TE111 right circular cylindrical microwave cavity made by Efratom Company and described in U.S. Pat. No. 3,798,565. Both designs, however, have disadvantages for their use in atomic absorption frequency standards.

The TE011 microwave resonant cavity shown in FIG. 2 is used in atomic frequency standards HP5065 and R20, manufactured by Hewlett-Packard Company and Varian Associates, respectively. One of the disadvantages to this resonant cavity is its relatively large size in comparison to the present invention. The volume of a resonant cavity is determined predominantly by its operating frequency; hence, in the present example of a rubidium gas cell, the required operating frequency of 6.8 Gigahertz determines the cavity size for a cavity operation in the TE011 mode. This TE011 resonant cavity also has the disadvantage of a high E-field in the region of the gas vapor cell. Consequently, the cavity is extremely sensitive to slight changes such as ambient temperature and the like.

To reduce the cavity size inherent in operating at the frequency necessary to excite the metal alkali vapor in the gas cell, one design uses the TE111 mode. This design is shown in FIG. 3. The cavity in this design is electrically loaded by incorporating a material with a high dielectric constant 30 and 32 in the cavity and by shaping the gas vapor cell 31 to the contour of the cavity to substantially fill the cavity. By contouring the gas cell, the gas cell also efficiently uses the reduced volume in the cavity caused by introducing a dielectric loading material in the cavity. See FIG. 1 of U.S. Pat. No. 3,798,565. One obvious disadvantage to this design is the special conformal shaping of the gas cell required to account for the protruding dielectric load in this resonant cavity. Such a requirement necessitates special handling and associated increased costs. Another disadvantage is the lack of a uniform H-field or a convenient H-field with which the optical axis could be aligned.

SUMMARY OF THE INVENTION

The preferred embodiment of the present invention provides a compact resonant cavity having a uniform H-field in which a gas vapor cell could operate. With a uniform H-field, improved frequency stability is obtained and cavity frequency changes are not masked or obscured.

In the preferred embodiment of the invention, a rectangular waveguide cavity operates in its TE012 mode. The cavity is substantially rectangular, but on opposite sides of the cavity is formed a secondary cavity to produce lumped resonant loading. The result from this particular design is a uniform H-field that is collinear to a uniform direct current magnetic field, or "C-field", to provide a well-defined optical path and detection axis.

DESCRIPTION OF THE PREFERRED EMBODIMENT

Figure 1A:
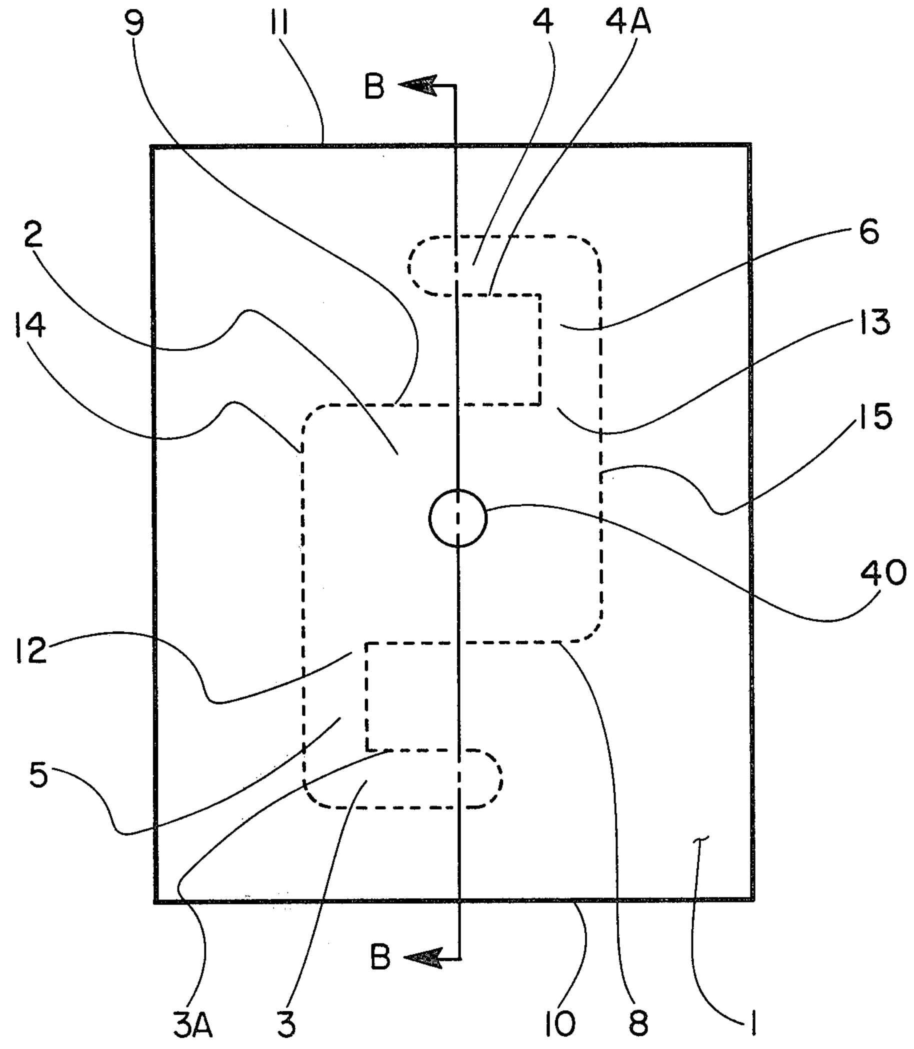
FIGS. 1A and 1C show the top and bottom views of one embodiment of the invention and FIG. 1B shows a sectional side thereof.

As depicted in FIG. 1, the preferred embodiment of the present invention is fabricated from a block 1 of electrically conductive material suitable for use in the propagation of microwave signals, for example, aluminum. A primary cavity 2 of substantially rectangular shape having a top opening 33 and a bottom opening 35 is formed through block 1 along its primary axis 20 to serve as a resonating cavity. Near a first corner 12 of primary cavity 2, between a primary cavity wall 8 and an exterior side 10 of block 1 and subtantially parallel to cavity wall 8, a first secondary cavity 3 extending through block 1 along a secondary axis 22 is formed to serve as a first lumped resonant load to primary cavity 2. Near a second corner 13 diagonally opposite corner 12, between a primary cavity wall 9 opposite wall 8 and an exterior side 11 and substantially parallel to primary cavity wall 8, a second secondary cavity 4 extending through block 1 along another secondary axis 24 is formed to serve as a second lumped resonant load to primary cavity 2. Both secondary axes 22 and 24 are substantially parallel to primary axis 20.

Interconnecting secondary cavity 3 to primary cavity 2 is an access channel 5 which, for example, can be formed by extending a primary cavity wall 14 to secondary cavity 3. Similarly, an access channel 6 is formed to interconnect primary cavity 2 to secondary cavity 4, for example, by extending a primary cavity wall 15. Access channels 5 and 6 extend respectively through the block material along tertiary axes 26 and 28, which are substantially parallel to primary axis 20.

It should be noted that sections 8' and 9' of the block defining secondary cavities 3 and 4 and access channels 5 and 6 form capacitive posts or capacitive obstacles in the resonant cavity.

Cover means 16, fabricated from the same or similar conducting materials as block 1 and with an aperture suitable for an optical axis, are attached to block 1, with screws or by brazing. Cover means 16 serve to cover the top and bottom openings of primary cavity 2 and to complete the resonant cavity. These cover means 16 are in direct contact with block 1 mainly around their periphery only; they must form a gap over capacitive posts 8' and 9' to serve as extended top and bottom access channels 19 and 21 between the primary and secondary cavities as illustrated in FIG. 1B. Alternatively, these extended top and bottom access channels 19 and 21 can be formed directly from block 1, such as by machining. If access channels 19 and 21 are formed this way, the need for separate cover means 16 is obviated.

This embodiment of the invention, if used at a resonant frequency of approximately 6.8 Gigahertz, would have a primary cavity 2 that is substantially 0.5 inch wide by 0.5 inch long by 0.4 inch high; the dimensions of cavity top and bottom openings 33 and 35, which are the same as the primary cavity cross-section dimension, are substantially 0.5 inch by 0.5 inch. Secondary cavities 3 and 4 each have cross-section dimensions that are substantially 1/5 by 3/5 of primary cavity 2 cross-section dimensions and is separated from nearest primary cavity wall 8 and 9, respectively, by approximately $\frac{1}{4}$ of the cross-section width of primary cavity 2, or 0.125 inch in this example. The interconnecting access channels 5 and 6 are each typically 0.07 inch wide. In this example, the secondary cavities 3 and 4 then have the dimensions of substantially 0.10 inch wide by 0.3 inch long by 0.4 inch high. A 0.3 inch face 3A and 4A of the secondary cavities 3 and 4 is substantially parallel to a 0.5 inch by 0.4 inch primary cavity wall 8 and 9, respectively.

Figure 1B:
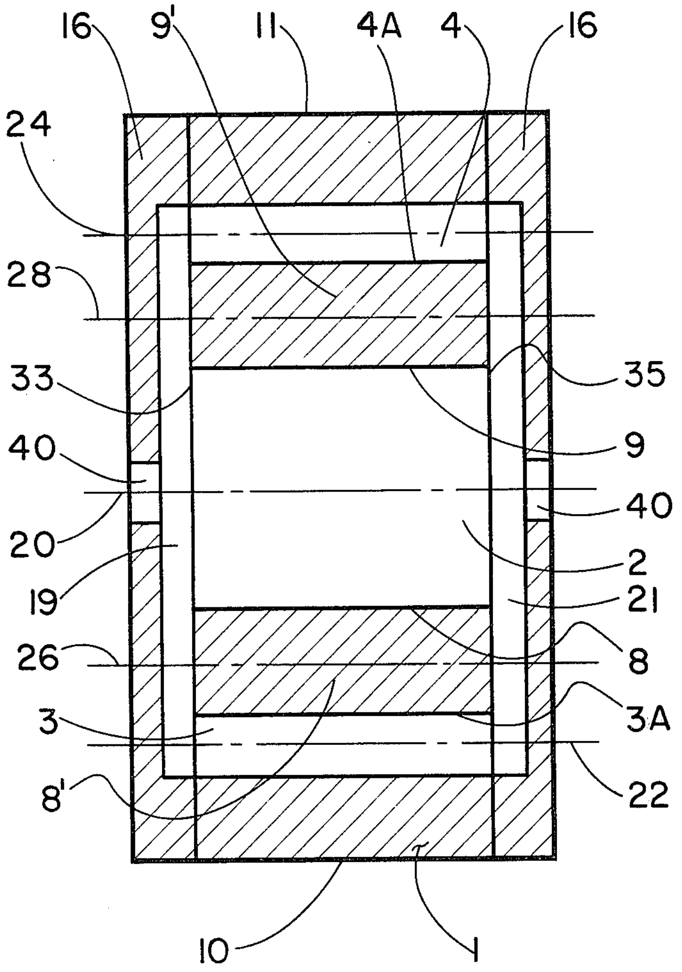
Figure 1C:
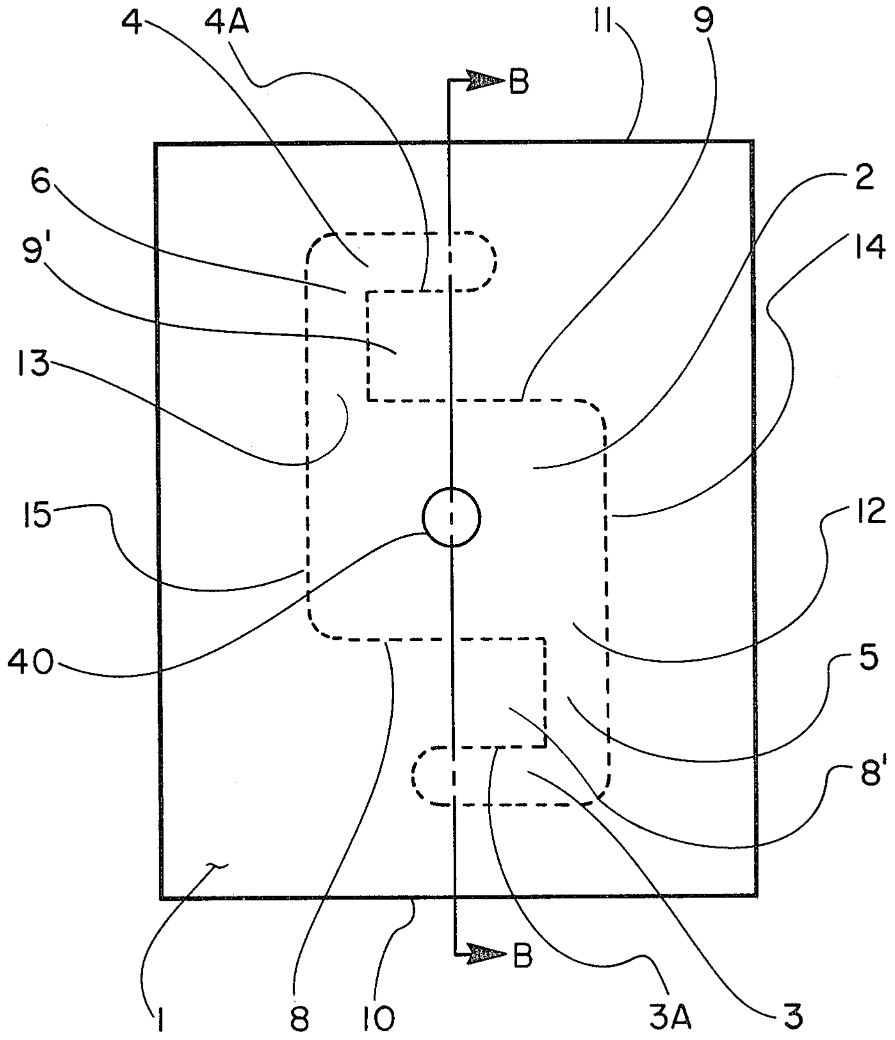
Figure 1D:
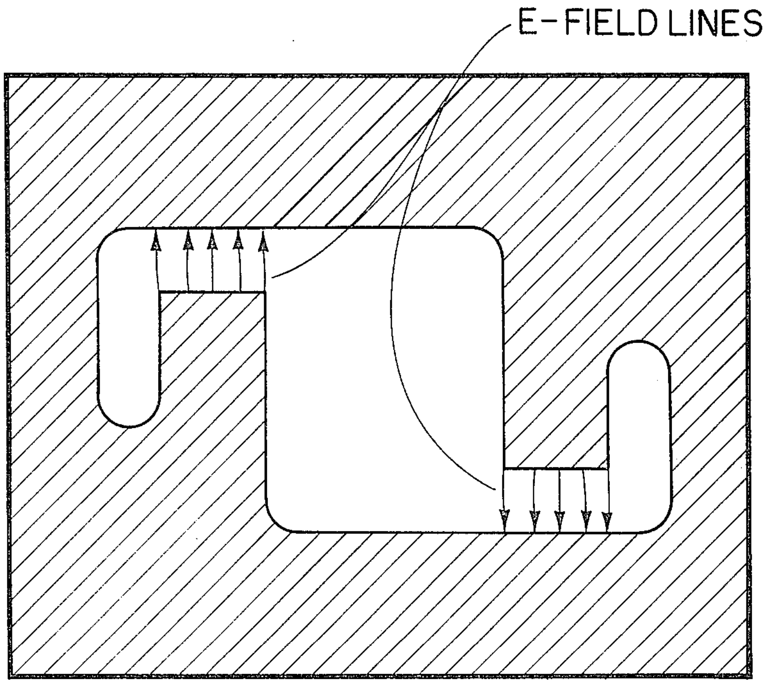
FIGS. 1D and 1E show the E-field and H-field lines, respectively, thereof.
Figure 1E:
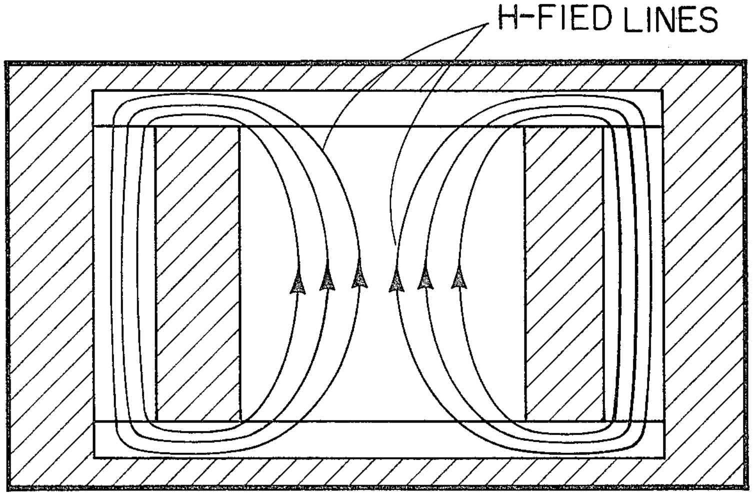
Figure 2B:
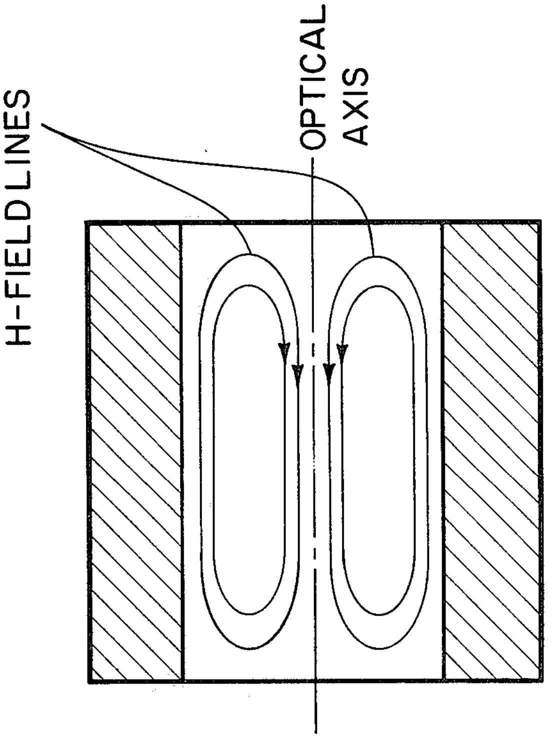
FIGURE 2B (PRIOR ART)
FIGS. 2A and 2B shows an example of a TE011 right circular cylindrical resonant cavity in the prior art with the cover means removed.
Figure 2A:
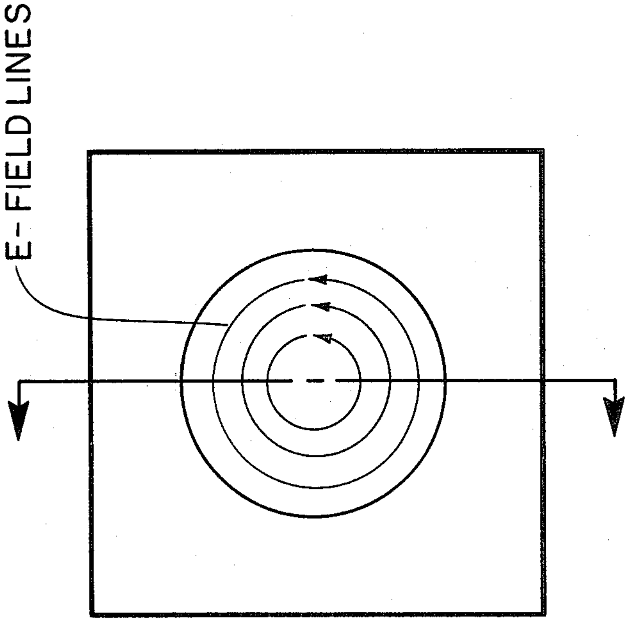
Figure 3B:
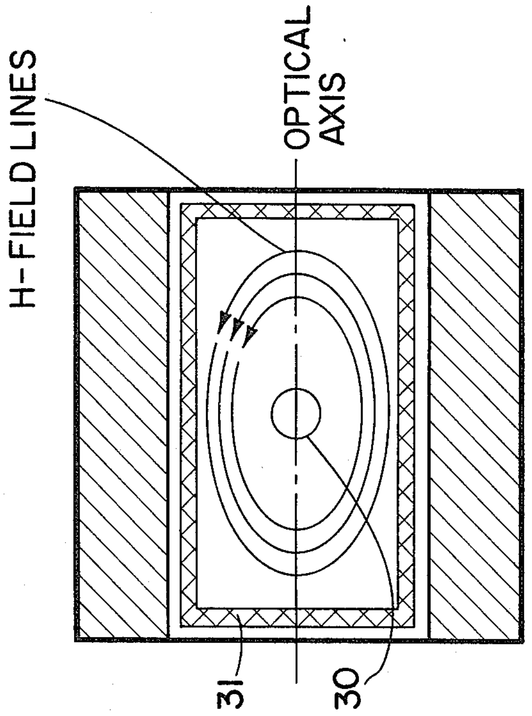
FIGURE 3B (PRIOR ART)
FIGS. 3A and 3B show an example of a TE111 right circular cylindrical resonant cavity in the prior art with the cover means removed.
Figure 3A:
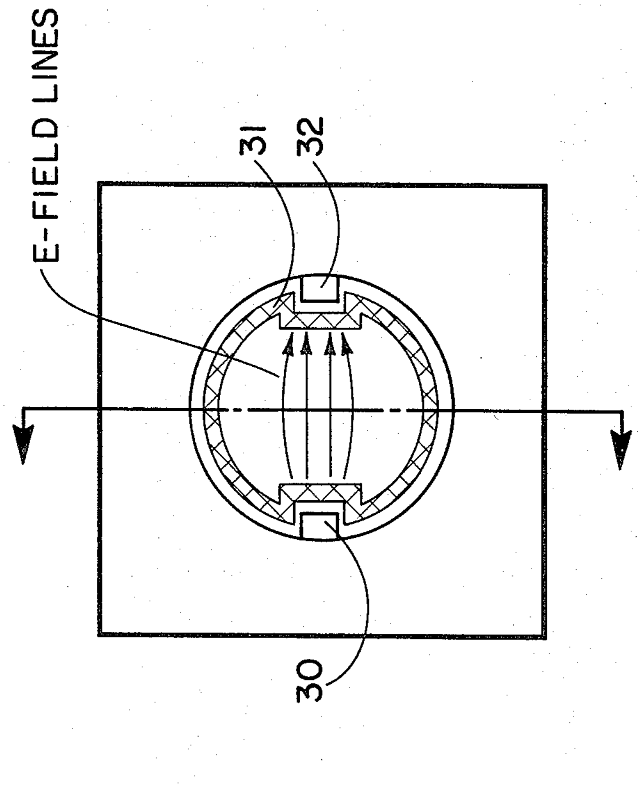
Figure 4:
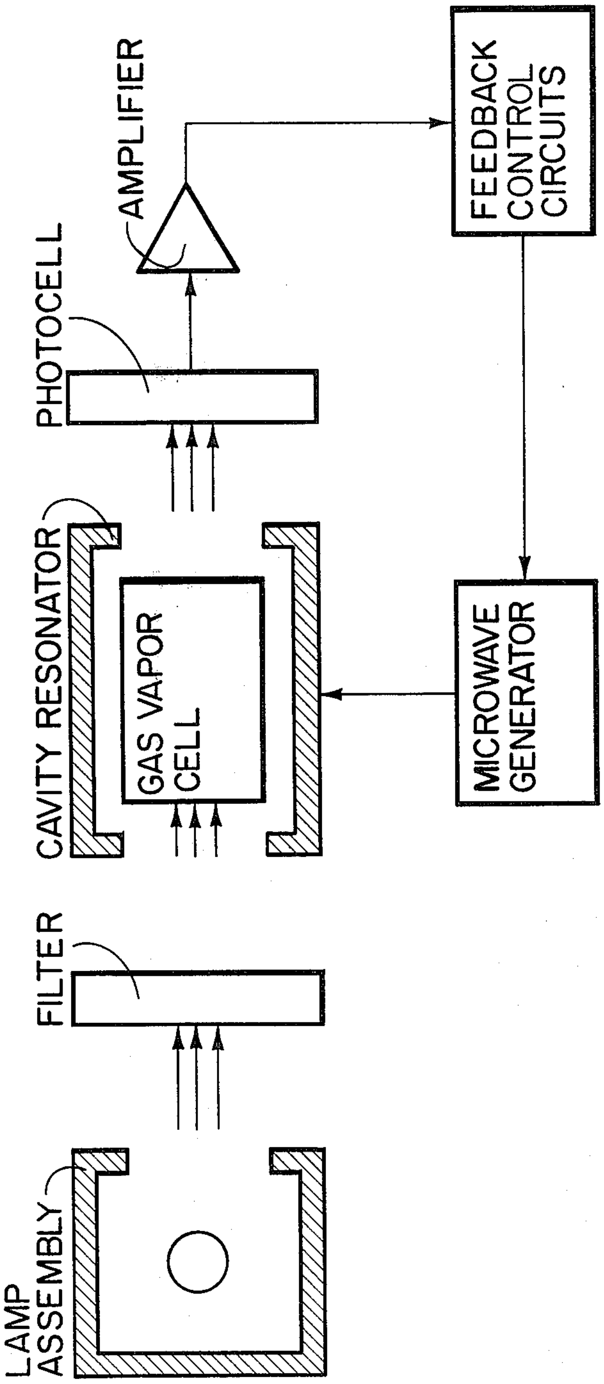
FIG. 4 depicts a block diagram of a typical application of a resonant cavity in a frequency absorption standard in the art.

In the foregoing discussion, the embodiment of the invention as illustrated in FIGS. 1A, 1B, and 1C is discussed. The discussion is applicable to alternate embodiments of the invention using secondary cavities connected to the primary cavity by access channels. By having a combination of primary and secondary cavities and channels in a waveguide block, a compact resonator cavity in accordance with the invention can be realized.

Figure 5B:
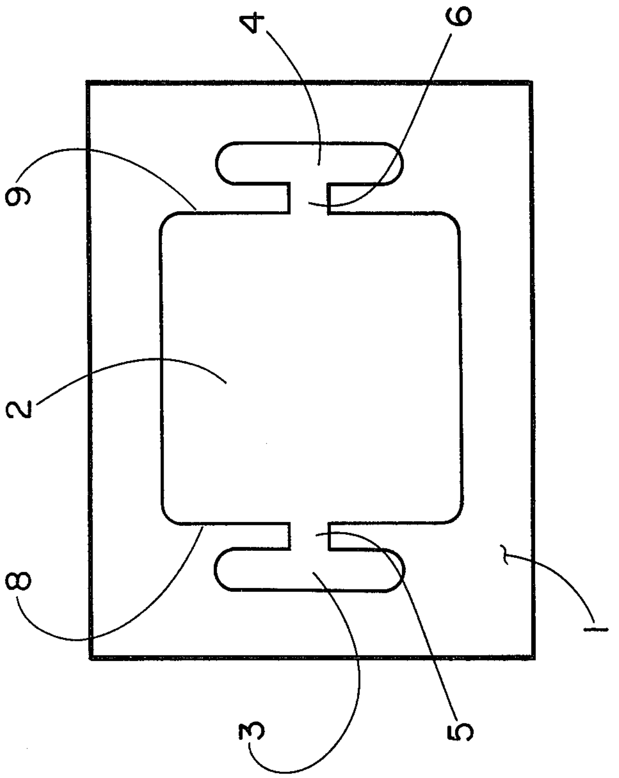
FIGS. 5A and 5B depict examples of alternate embodiments of the invention with the cover means removed.
Figure 5A:
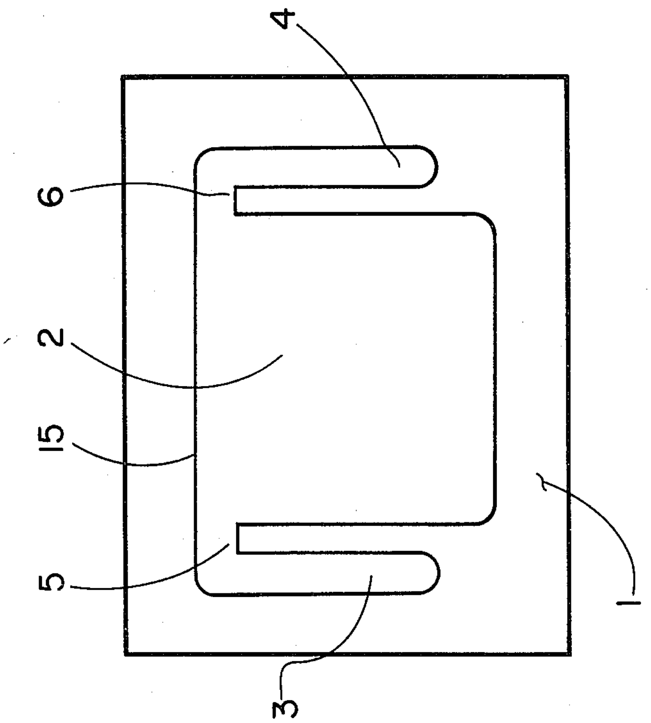

Two alternate embodiments of the invention are shown without their cavity cover means in FIGS. 5A and 5B. In FIG. 5A, secondary cavities 3 and 4 are located on opposite sides of primary cavity 2, but are disposed towards one side of the cavity block. Access channels 5 and 6 are formed by extending primary cavity wall 9 to intersect the secondary cavities to complete the resonant cavity in accordance with the invention. A cross-section of such a combination of cavities and channels essentially has an E shape. In FIG. 5B, the resonant cavity shown has secondary cavities 3 and 4 located on opposite sides of primary cavity 2 with access channels 5 and 6 radiating from essentially the midpoints of primary cavity walls 7 and 8 and intersecting the secondary cavities to substantially form a T as shown.

We claim:

1. A resonant cavity comprising a block of electrically conductive material having:

a primary cavity extending through the block along a primary axis;

first and second secondary cavities located on opposite sides of the primary cavity, each extending through the material along secondary axes which are substantially parallel to the primary axis;

first and second access channels interconnecting the first and second secondary cavities with the primary cavity, respectively, each of the channels extending through the material along tertiary axes which are substantially parallel to the primary axis; and top and bottom cover means in contact mainly at their peripheries with the top and bottom of the block, respectively, for covering the cavities and for providing extended top and bottom access channels between cavities, wherein said top and bottom cover means have an aperture for an optical axis.

2. A resonant cavity as in claim 1 wherein said top and bottom cover means are integral to said block.

3. A resonant cavity as in claims 1 or 2 wherein said primary cavity has four walls that define a substantially rectangular cross-section to the primary cavity.

4. A resonant cavity as in claim 3 wherein each of said secondary cavities has four walls that define a substantially rectangular cross-section to the secondary cavity and each said secondary cavity is substantially parallel to opposite walls of said primary cavity.

5. A resonant cavity as in claim 4 for the frequency of substantially 6.8 GHz wherein said resonant cavity block is 0.4 inch high, said primary cavity is 0.4 inch high and has a substantially uniform cross-section of substantially 0.5 inch by 0.5 inch, and wherein said secondary cavities are parallel to opposite 0.5 inch by 0.5 inch primary cavity walls.

6. A resonant cavity as in claim 5 wherein said secondary cavities typically have a substantially uniform cross-section of $1/5 \times 3/5$ of the cross-section dimensions of the primary cavity, and further are separated from the nearest primary cavity wall by substantially $\frac{1}{4}$ of the primary cavity cross-section width.

7. A resonant cavity as in claim 6 wherein each said access channel is typically 0.07 inch wide and extends from one primary cavity wall to one end of said secondary cavities located proximately at diagonal corners of said primary cavity.

8. A resonant cavity as in claim 7 wherein each said access channel is formed by extending a primary cavity wall which is perpendicular to the length of said secondary cavities located proximately at diagonal corners of said primary cavity and wherein a cross-section of the combination of first and second secondary cavities, primary cavity, and first and second access channels has an essentially S shape.

9. A resonant cavity as in claim 4 wherein said access channels are formed by extending one primary cavity wall and wherein one end of each of said seconary cavities extends from said extended primary cavity wall to provide a combination of said primary and second cavities and access channels having a cross-section of an essentially E shape.

10. A resonant cavity as in claim 4 wherein said access channels are substantially located in the midpoints of opposite primary cavity walls and wherein each of said secondary cavities intersect with one of said access channels to form a substantial T.

* * * * *

UNITED STATES PATENT AND TRADEMARK OFFICE

CERTIFICATE OF CORRECTION

PATENT NO. : 4,349,798

DATED : September 14, 1982

INVENTOR(S) : Allen F. Podell; Louis F. Mueller

It is certified that error appears in the above-identified patent and that said Letters Patent are hereby corrected as shown below:

In the Abstract, the last sentence should read as follows:

The compact resonant cavity is designed for applications in atomic frequency standards.

In column 2, line 51, delete "shows" and insert --show-- therefor.

In column 3, line 65, after "0.3 inch" insert --by 0.4 inch--.

Signed and Sealed this

*Twenty-eighth* Day of *December 1982*

[SEAL]

*Attest:*

GERALD J. MOSSINGHOFF

*Attesting Officer* *Commissioner of Patents and Trademarks*